(12) United States Patent
Probst

(10) Patent No.: US 6,825,510 B2
(45) Date of Patent: Nov. 30, 2004

(54) TERMINATION STRUCTURE INCORPORATING INSULATOR IN A TRENCH

(75) Inventor: Dean Probst, West Jordan, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 57 days.

(21) Appl. No.: 10/247,461

(22) Filed: Sep. 19, 2002

(65) Prior Publication Data

US 2004/0056310 A1 Mar. 25, 2004

(51) Int. Cl.⁷ ................................................. H01L 27/10
(52) U.S. Cl. ........................ 257/208; 257/203; 257/204
(58) Field of Search ................................ 257/203, 204, 257/208, 401

(56) References Cited

U.S. PATENT DOCUMENTS

| | | | |
|---|---|---|---|
| 4,876,579 A | | 10/1989 | Davis et al. |
| 5,233,215 A | | 8/1993 | Baliga |
| 5,393,998 A | * | 2/1995 | Ishii et al. .................. 257/256 |
| 5,578,851 A | | 11/1996 | Hshieh et al. |
| 5,589,405 A | * | 12/1996 | Contiero et al. ............ 438/268 |
| 5,605,852 A | | 2/1997 | Bencuya |
| 5,639,676 A | | 6/1997 | Hshieh et al. |
| 6,110,763 A | | 8/2000 | Temple |
| 6,188,105 B1 | | 2/2001 | Kocon et al. |
| 6,362,026 B2 | | 3/2002 | Zeng et al. |
| 6,459,113 B1 | * | 10/2002 | Morihara et al. ........... 257/296 |

* cited by examiner

*Primary Examiner*—Allan R. Wilson
(74) *Attorney, Agent, or Firm*—Thomas R. FitzGerald

(57) ABSTRACT

A power semiconductor device 10 has increased breakdown voltage due to an oxide termination structure. A peripheral trench 58 is filled with a dielectric material, such as silicon dioxide. The trench extends below the P well 22 that includes the source 32. The electric field at the border to P well 22 and trench 60 turns upward toward the surface and passes through dielectric 60. A field plate 64 coves portions of the P well 22 and the dielectric 60.

13 Claims, 3 Drawing Sheets

TERMINATION STRUCTURE INCORPORATING INSULATOR IN A TRENCH

FIELD OF THE INVENTION

This invention relates to semiconductor devices and, more particularly, to semiconductor power devices and methods for fabricating such devices.

BACKGROUND OF THE INVENTION

Power switching devices of the type which operate on field effect principles are devices of choice for handling large currents and large voltages. These devices provide low on-resistance, fast switching speeds and low current draw during switching operations. Typically, such devices are formed on a semiconductor layer with a number of transistor cells connected in parallel to maximize current handling capability. For a conventional diffused MOS (DMOS) transistor, each cell includes a doped source region, a body region and a channel region controllable with a gate electrode. Commonly, such devices are formed with a trenched gate electrode to increase device density. Another common power device for handling high currence is the Insulated Gate Bipolar Transistor (IGBT) which is a four layer device that operates on field effect principles.

Generally, the operating voltage of such devices is dependent in part on the sustainable voltage that the device will provide during the off conduction state, in particular, during reverse bias conditions. It is conventional in power device design to incorporate edge termination techniques along the outer periphery of the device on which the transistors are formed in order to increase the voltage at which junction breakdown would occur. Specifically, the breakdown voltage must be significantly higher than that of the region in which active transistor cells operate.

Numerous techniques are known for maximizing the breakdown voltage in the termination region. These include field rings, channel stop implants and field plates. Absent such techniques it would not be possible to approach the theoretical breakdown voltage of a semi-infinite junction. For further discussion on edge termination design see Ghandhi, *Semiconductor Power Devices*, John Wiley & Sons, Inc., 1977 (ISBN 0-471-02999-8), incorporated herein by reference, which discusses this subject at chapter two. See, also, Baliga, *Modern Power Devices*, PWS Publishing Company, Boston, Mass., 1996 (ISBN 0-534-94098-6), also incorporated herein by reference, which provides relevant discussion at chapter three. In addition to conventional field rings and field plates, trenched field plates have been considered for edge termination applications. U.S. Pat. No. 5,233,215 discloses use of one or more trenched, floating field plates in combination with field rings in order to terminate a silicon carbide MOSFET. U.S. Pat. No. 5,578,851 discloses field rings separated by trenches, allowing the field rings to be closely spaced in order to conserve area. The trenches may be filled with polysilicon electrically connected to the MOSFET gate electrode.

As performance requirements continue to become more stringent, it is desirable to develop additional techniques to elevate the breakdown voltage in the termination region of a power device.

SUMMARY OF THE INVENTION

According to the invention, an insulator layer may be positioned with respect to a diffusion region in a layer of opposite conductivity type, to contain, when a reverse bias voltage is applied across the junction, the peak field concentration within the insulator layer. In one exemplary embodiment of the invention, a semiconductor device is provided having a first layer of first conductivity type with a diffusion region of second conductivity type formed along the surface and extending to a first depth within the first layer, the diffusion region forming a pn junction with the first layer. A field plate has a first portion extending over the diffusion region and a second portion extending to a peripheral region of the device and a dielectric layer is formed within the first layer, extending to at least the first depth. Preferably, the dielectric layer is positioned between the diffusion region and the peripheral region in abutment with the diffusion region. The dielectric layer may be formed in a trench extending into the diffusion region beyond the first depth.

In other embodiments a semiconductor device with a field plate structure formed along an outer periphery includes a semiconductor layer of predominately a first net conductivity type and a diffusion region of a second net conductivity type formed in the semiconductor layer. An insulator layer is formed in contact with the diffusion region and extends into the semiconductor layer to at least the same depth as the diffusion region. A field plate extends from over the diffusion region to over the insulator layer.

A method is provided for altering the peak field concentration under reverse bias conditions in a semiconductor device of the type having a first layer of first conductivity type forming a junction with a diffusion region of second conductivity type formed along an upper surface. A field plate is formed over the surface with a first portion extending over the diffusion region and a second portion extending peripherally to position the peak field concentration in a region of the first layer other than the junction. In one example, an insulative layer is formed in the first layer in abutment with the diffusion region to position the peak field concentration within the insulative layer. An edge termination ring may be formed along the upper surface, extending from the insulative layer to the outer periphery of the device.

A method is also provided for controlling reverse bias breakdown voltage characteristics in a semiconductor device layer having an insulator region formed next to a diffusion region. The method includes locating the peak field concentration, which occurs in the device layer during reverse bias conditions, in the insulator region. In one embodiment, the peak field concentration is located by positioning a field plate over the insulator region and the diffusion region. Preferably, the insulator region is formed through the diffusion region.

A method for controlling avalanche breakdown conditions applies to a semiconductor layer of a first conductivity type and a region of a second conductivity type formed in the layer. A field plate is positioned over the region of second conductivity type and an insulator is positioned within the layer to place the peak field concentration during the reverse bias condition entirely within the insulator. The insulator may extend into the semiconductor layer to a depth greater than the depth of the region of the second conductivity type.

BRIEF DESCRIPTION OF DRAWINGS

The invention will be more fully understood when the following detailed description is read in conjunction with the drawings wherein.

Figure 1:
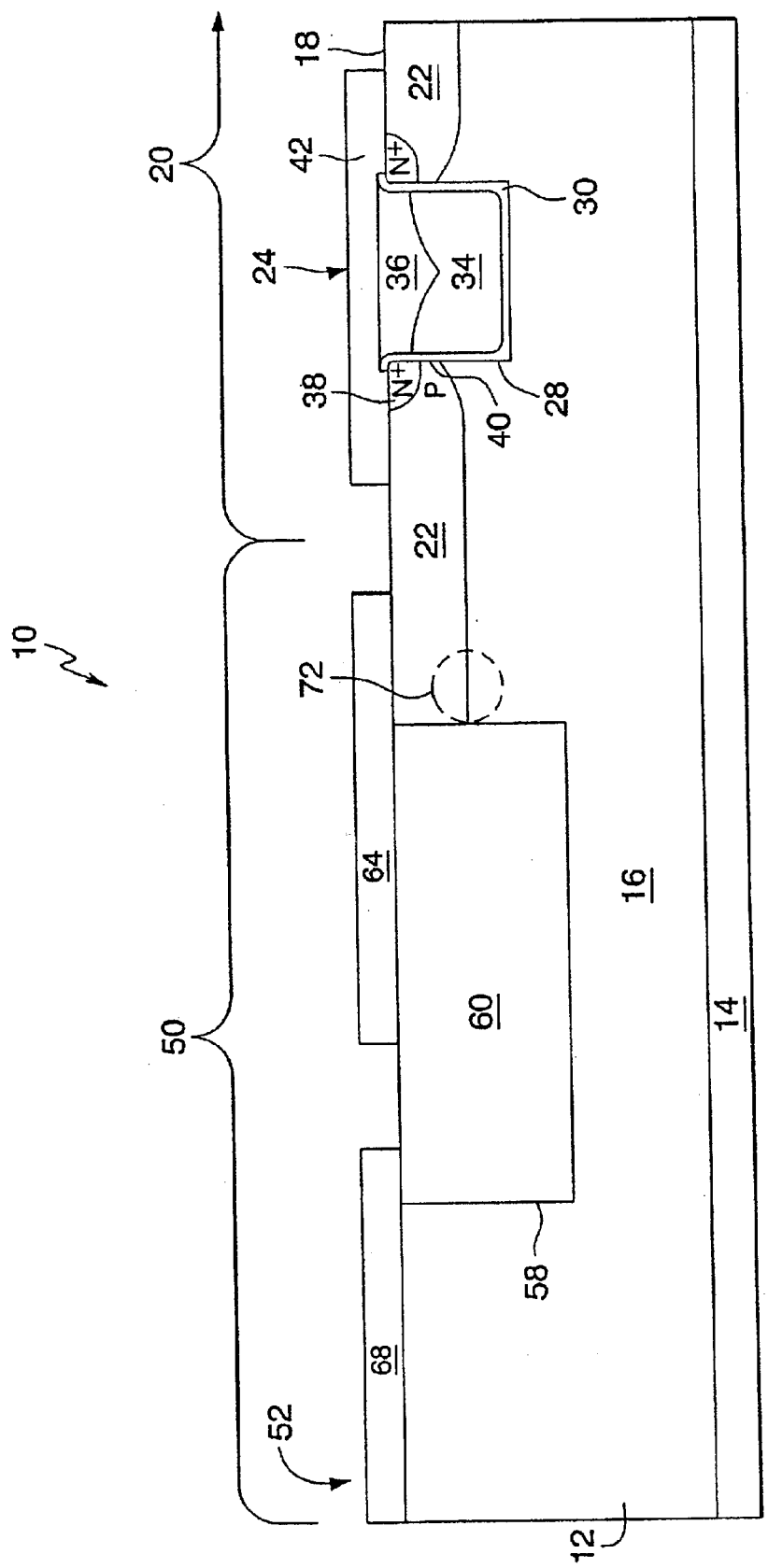
FIG. 1 is a partial view in cross section of a semiconductor device incorporating the invention.

In accord with common practice the various illustrated features in the drawings are not to scale, but are drawn to emphasize specific features relevant to the invention. Moreover, the sizes of features and the thicknesses of layers may depart substantially from the scale with which these are shown. Reference characters denote like elements throughout the figures and the text.

DETAILED DESCRIPTION OF THE INVENTION

The partial cross-sectional view of FIG. 1 illustrates a P-channel MOSFET device 10 formed in a semiconductor layer 12, including N+ lower layer 14 and N− upper layer 16 which may, for example, be epitaxially grown. The layer 16 has an upper surface 18. A P+ diffusion region 22 extends from the surface 18 into the upper layer 16. An active transistor region 20 of the device 10 (right side of drawing) includes a repetitive pattern of MOS cell structures each having a vertical source/drain formation. For simplicity of illustration only one exemplary MOSFET cell 24 is shown extending through a body region portion of the diffusion region 22. The device 10 will include many MOSFET cells, although the specific design of the cell 24 is exemplary while the invention is not at all limited to any particular type of cell design nor limited solely to MOSFET devices. It should also be noted that the invention, while described for a vertical structure transistor cell design, is applicable to other device designs as well.

The cell 24 comprises a trench 28, conventionally lined with a thermally grown gate oxide layer 30 having thickness in the range of 800 to 1200 Angstroms (80 to 120 nm). The trench may have a depth on the order of 1.5 to 3 microns with a width of one to two microns and is substantially filled with conductive material, e.g., doped polysilicon, to form a conductive gate electrode 34. The balance of the trench opening is conventionally filled with deposited insulator 36 which may, for example, be borophosphorosilicate glass (BPSG). N+ source region 38 is formed along the surface 18 in an upper portion of the layer 16 surrounding the trench 28. Lightly P-doped channel region 40 is formed in the otherwise more heavily doped diffusion region 22, between the source region 38 and that portion of the N− layer 16 along the trench 28 which forms the drift region of the cell 24.

The oxide layer 30 provides electrical isolation between the gate electrode 34 and each of the source region 38, channel region 40 and N− layer 16 (drain), allowing a conductive inversion layer to form in the channel region 40 when a voltage is applied to the gate electrode 34 relative to the source region 38. A source contact 42, e.g., Al, is provided for connection to the P+ region 22 as well as the source region 38 in order to suppress parasitic NPN bipolar effects which could occur under forward bias conditions, i.e., with the combination of the N+ region 38, the P+ region 22 and the N-type layers 14 and 16.

Still referring to FIG. 1, a termination region 50 (left side of drawing) extends from the active region 20 to the outer periphery 52 of the device 10. A trench 58, preferably having a width substantially larger than that of the trench 28, is formed through one end of the P+ region 22 in the termination region 50. It may, for example, be three to six microns deep and three to five microns wide, but the trench 58 could be made substantially larger based on desired device breakdown characteristics. The trench 58 is filled with dielectric material 60 which may include the gate oxide layer 30 as well as deposited material. The dielectric material 60 may, for example, comprise a silicon oxide formed by chemical vapor deposition. A field plate 64, e.g., doped polysilicon or metal, is formed over the trench 58 and an adjoining portion of the diffusion region 22. A field termination ring 68 is positioned over the trench 58 and extends to the outer periphery 52, e.g., the edge of the device 10.

A feature of the device 10 is that the trench 58 is formed in a portion of the layer 16 in which the region 22 has been formed. That is, an end portion of the region 22 is removed when the trench 58 is formed. As a result, an adjoining portion of the junction between the layer 16 and the region 22 which intersects the trench 58 (denoted by a hatched circle and reference number 72) is essentially a parallel junction approximating a plane junction. When a reverse bias voltage is applied between the field plate 64 and the layer 16, the electric field lines along the portion 72 of the junction are parallel while the field lines penetrating into the dielectric material 60 are characterized by curvature with relatively high field concentration.

A configuration which allows such curvature of the electric field in the dielectric material 60 rather than in the junction region 72 is advantageous. That is, even when the peak field concentration in the dielectric material 60 is greater than the peak field concentration would otherwise be at the junction of the layer 16 and the region 22, the dielectric material 60 in the trench 58 nonetheless provides improved breakdown voltage characteristics. This is because the dielectric material 60 can sustain a higher peak field concentration without incurring breakdown than can the region about the semiconductor junction.

With the field plate 64 extending over the dielectric material 60, under reverse bias conditions the field lines within the material 60 and close to the region 72 are substantially parallel. The field lines transition to curved field lines in the portion of the dielectric material which extends beyond the field plate 64.

Figure 2:
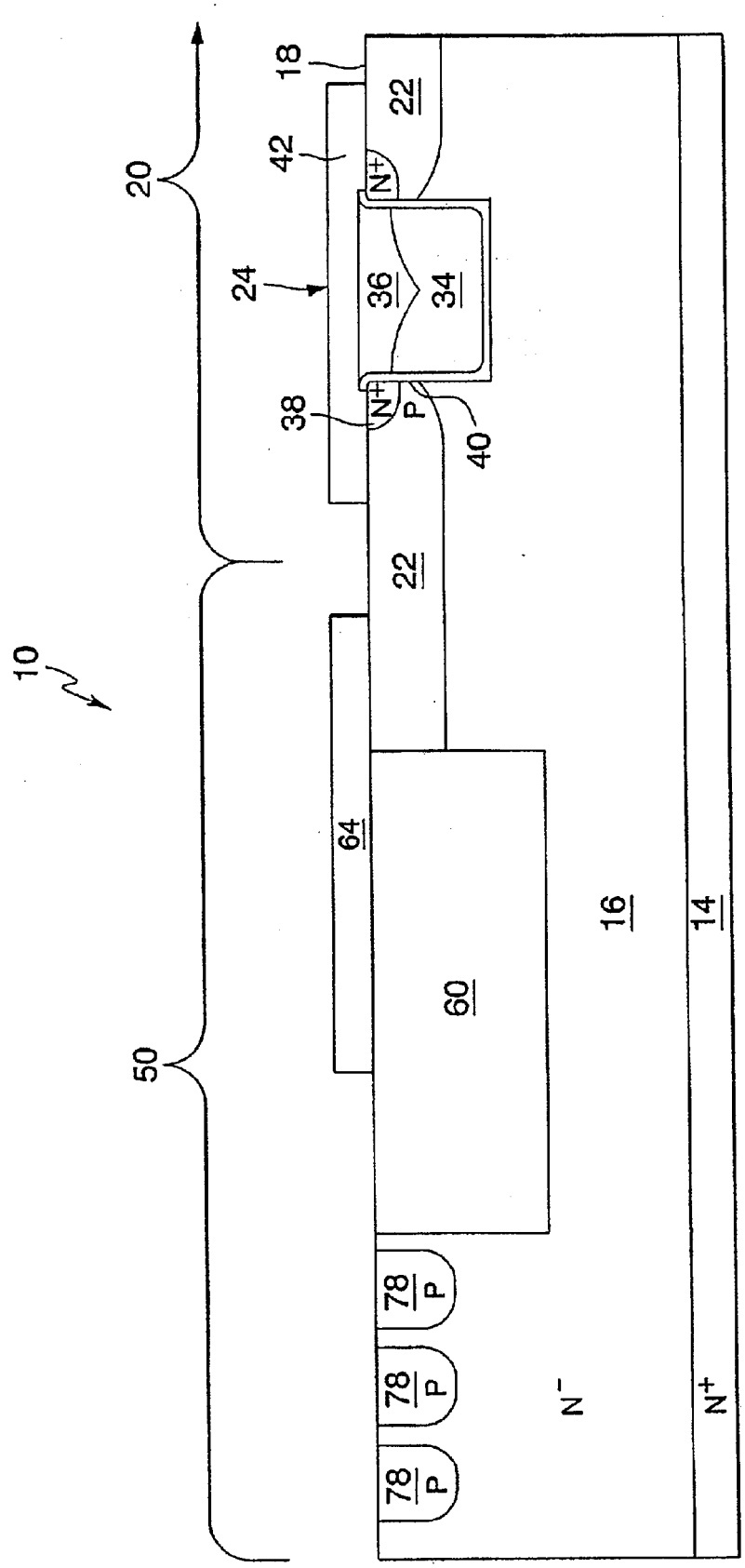
FIG. 2 is a partial view in cross section of a semiconductor device according to an alternate embodiment of the invention.

FIG. 2 illustrates an alternate embodiment of the device 10 wherein the single equipotential ring 68 of FIG. 1 is replaced by multiple field rings 78. As shown in FIG. 2, the field rings are most preferably formed as P-type diffusions.

Figure 3A:
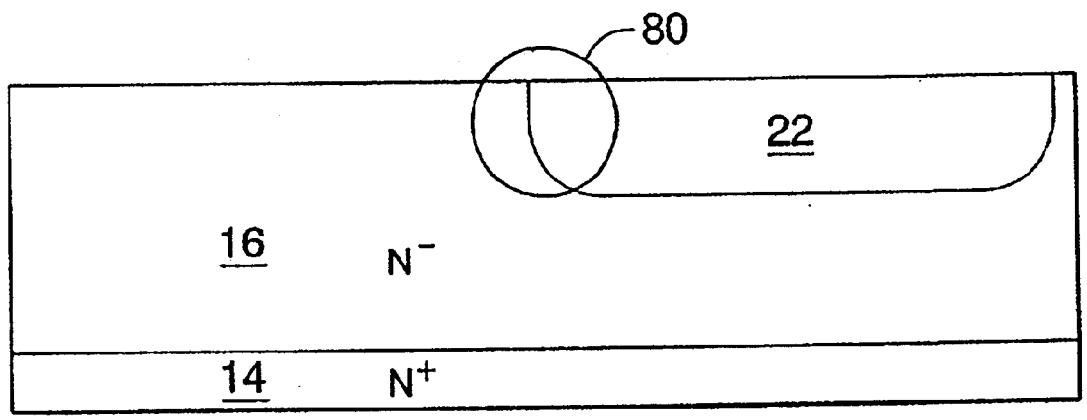
FIGS. 3A and 3B illustrate a partial fabrication sequence for an embodiment of the invention.
Figure 3B:
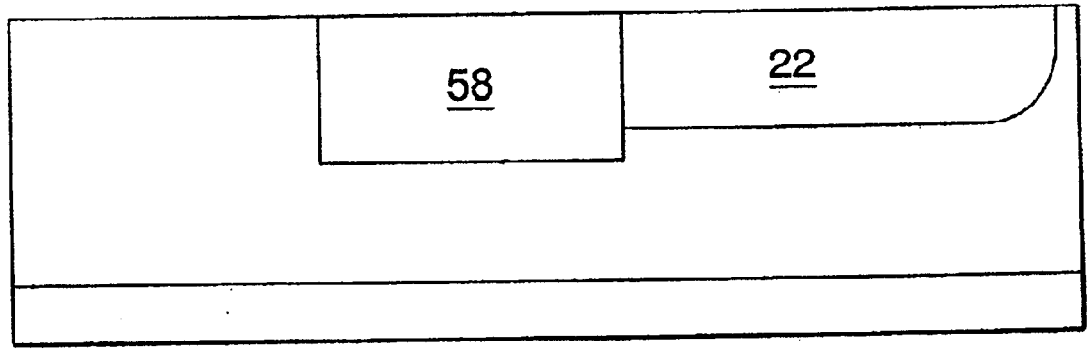

FIGS. 3A and 3B illustrate the termination region 50 of the device 10 during select stages of an exemplary fabrication process. Other aspects of device manufacture are conventional and not illustrated. After formation of the N− upper layer 16, the diffusion region 22 is formed with a standard pattern and etch technique followed by a P-type implant. See FIG. 3A. With another conventional pattern and etch sequence, followed by an anisotropic etch, the trench 58 is defined along the surface 18. Notably, the trench is formed through the portion of the diffusion region 22 extending into the termination region 50, removing an end tail 80 of the region 22 which would otherwise curve toward the surface 18. The remaining portion of the region 22 in the termination region 50 is essentially plane as described with reference to the junction region 72 in FIG. 1.

Preferably, the trench 58 and the trench 28 are formed simultaneously and deposit of insulator to form the dielectric material 60 may be coincident with deposit of the insulator 36, e.g., BPSG. If the trench 58 is formed in conjunction with the trench 28, additional etching would be required in order for it to extend deeper into the upper layer 16 than the trench 28. The trench 58 does extend at least as deep as the diffusion region 22 and, preferably, extends substantially deeper than the diffusion region 22. See FIG. 3B.

If the trench 58 is filled with dielectric material 60 during a different process step than other trench fills, then the other openings such as the trench 28 along the surface 18 are masked off. This may be desirable when the dielectric material 60 is a different composition than the material deposited in the other openings. Such alternate materials include High Density Plasma (HDP) silicon oxide, TEOS-deposited oxide, silicon nitride or other dielectric material, the choice of which will depend in part on the selection of other semiconductor materials and the voltage requirements for the device 10. As noted above, the trench 60 may be lined with a thermal oxide formed coincident with the gate oxide 30, prior to deposition of other dielectric material.

With the dielectric material 60 deposited the surface 18 is planarized. The contact 42, field plate 64 and edge ring 68 may be simultaneously formed with sputtered Al followed by a photoresist pattern and etch sequence. Alternatively, the field plate 64 and edge ring 68 may be patterned from deposited polysilicon.

An advantage of the invention is that the peak field concentration associated with a junction formed according to a planar process is translated to a region of the device that can support higher voltage before avalanche than can be supported at the semiconductor junction. As a result, the peak field concentration can reside in a material capable of supporting higher voltages while the economies of conventional device fabrication are retained. Generally, this enables a higher breakdown voltage at the die edge with few or no additional process steps.

Although the invention has been described for a particular device type, the concepts apply to edge termination design for a wide variety of devices types and there is no limit on the voltage range of devices with which the invention may be practiced. The design principles may be readily applied to prevent breakdown voltages well in excess of 200 volts.

An architecture and process have been described for an improved semiconductor device. Exemplary embodiments have been disclosed while other embodiments of the invention, including structures composed of compound semiconductor materials, will be apparent. It is also to be understood that when a layer has been described or illustrated as positioned on or over another layer, there may be another intervening layer (not illustrated) associated with the same or an alternate embodiment of the invention. Moreover, although the invention has been illustrated for one set of conductivity types, application of the invention is contemplated for opposite conductivity-type devices as well. Because the invention may be practiced in a variety of ways, the scope of the invention is only limited by the claims which now follow.

I claim:

1. A semiconductor device comprising:
   a first layer of first conductivity type having an upper surface;
   a diffusion region of second conductivity type formed along the surface end extending to a first depth within the first layer, said diffusion region forming a pn junction with the first layer;
   a dielectric layer formed within the first layer and extending to at least the first depth, said dielectric layer positioned between the diffusion region and a peripheral region of the device, said dielectric layer in abutment with the diffusion region; and
   a field plate disposed upon and in contact with at least a portion of each of the diffusion region and the dielectric layer.

2. The device of claim 1 wherein the dielectric layer is formed in a trench.

3. The device of claim 1 wherein the dielectric layer extends into the diffusion region beyond the first depth.

4. The device of claim 1 wherein the diffusion region is of a net P-type dopant concentration.

5. The device of claim 1 further including an active region comprising a MOSFET transistor with the field plate and dielectric layer formed in a region of the layer extending from the active region to the peripheral region of the device.

6. A semiconductor device with a field plate structure formed along an outer periphery thereof, comprising:
   a semiconductor layer of predominately a first net conductivity type;
   a diffusion region of a second net conductivity type formed in an upper surface of the semiconductor layer;
   an insulator layer formed in contact with the diffusion region and extending into the semiconductor layer to at least the same depth as the diffusion region; and
   a field plate disposed at least partially over and in contact with each of the diffusion region and the insulator layer.

7. The device of claim 6 wherein the diffusion region is of a net P-type dopant concentration.

8. The device of claim 6 further including an active region comprising a MOSFET transistor and wherein the field plate and dielectric layer are formed in a region of the layer extending from the active region to the outer periphery of the device.

9. The device of claim 6 wherein the insulator layer extends from the diffusion region toward the outer periphery and the field plate extends from the diffusion region toward the outer periphery and beyond the insulator.

10. The device of claim 1, further comprising a field termination member disposed at least partially over and in contact with the dielectric layer and extending to a peripheral region of the device.

11. A field plate termination structure for a semiconductor device, said semiconductor device having a first layer of a first conductivity type, said first layer having an upper surface, a diffusion region of second conductivity type formed along the upper surface and extending to a first depth within the first layer, said diffusion region forming a p-n junction with the first layer, said field plate termination structure comprising:
   a dielectric layer formed at least partially within the first layer and extending to at least the first depth, said dielectric layer positioned between the diffusion region and a peripheral region of the device, said dielectric layer in abutment with the diffusion region;
   a field plate member disposed upon and in contact with at least a portion of each of the diffusion region and the dielectric layer; and
   a field termination member disposed between said field plate member and the peripheral region.

12. The field plate termination of claim 11, wherein said field termination member is disposed at least partially over and in contact with the dielectric layer and extends to the peripheral region.

13. The field plate termination of claim 11, wherein said field termination member comprises at least one field plate ring disposed at least partially within the first layer.

* * * * *